US012662628B2

(12) United States Patent
Mizutani et al.

(10) Patent No.: US 12,662,628 B2
(45) Date of Patent: Jun. 23, 2026

(54) SEMICONDUCTOR ETCHING SOLUTION

(71) Applicants: FUJIFILM Corporation, Tokyo (JP); FUJIFILM Electronic Materials U.S.A., Inc., North Kingstown, RI (US)

(72) Inventors: Atsushi Mizutani, Shizuoka (JP); Mick Bjelopavlic, North Kingstown, RI (US); Carl Ballesteros, North Kingstown, RI (US)

(73) Assignees: FUJIFILM Corporation, Tokyo (JP); FUJIFILM Electronic Materials U.S.A., Inc., North Kingstown, RI (US)

( * ) Notice: Subject to any disclaimer, the term of this patent is extended or adjusted under 35 U.S.C. 154(b) by 198 days.

(21) Appl. No.: 18/408,579

(22) Filed: Jan. 10, 2024

(65) Prior Publication Data

US 2024/0166948 A1 May 23, 2024

Related U.S. Application Data

(63) Continuation of application No. PCT/JP2022/026794, filed on Jul. 6, 2022.

(60) Provisional application No. 63/220,566, filed on Jul. 12, 2021.

(51) Int. Cl.

| | |
|---|---|
| ***C09K 13/08*** | (2006.01) |
| ***C09K 13/00*** | (2006.01) |
| ***C09K 13/06*** | (2006.01) |
| ***H10P 50/00*** | (2026.01) |
| ***H10P 50/64*** | (2026.01) |
| ***H10P 52/40*** | (2026.01) |
| ***H10P 72/00*** | (2026.01) |
| ***H10W 20/00*** | (2026.01) |

(52) U.S. Cl.

CPC .............. *C09K 13/08* (2013.01); *C09K 13/00* (2013.01); *C09K 13/06* (2013.01); *H10P 50/00* (2026.01); *H10P 50/642* (2026.01); *H10P 52/403* (2026.01); *H10P 72/0422* (2026.01); *H10W 20/062* (2026.01)

(58) Field of Classification Search

None

See application file for complete search history.

(56) References Cited

U.S. PATENT DOCUMENTS

| | | | | |
|---|---|---|---|---|
| 11,875,997 | B2 | 1/2024 | Bilodeau | |
| 2004/0063286 | A1 | 4/2004 | Kim et al. | |
| 2018/0163130 | A1* | 6/2018 | Kim | H10D 30/6744 |
| 2018/0294165 | A1 | 10/2018 | Bilodeau | |
| 2019/0025703 | A1* | 1/2019 | Shimizu | G03F 7/327 |
| 2019/0088492 | A1* | 3/2019 | Liu | H01L 21/02381 |
| 2019/0103282 | A1 | 4/2019 | Ge et al. | |
| 2020/0211856 | A1 | 7/2020 | Wada et al. | |
| 2024/0096635 | A1 | 3/2024 | Bilodeau | |

FOREIGN PATENT DOCUMENTS

| | | |
|---|---|---|
| JP | 2020517108 | 6/2020 |
| KR | 20190122832 | 10/2019 |

OTHER PUBLICATIONS

"International Search Report (Form PCT/ISA/210) of PCT/JP2022/026794," mailed on Aug. 9, 2022, pp. 1-3.

"Written Opinion of the International Searching Authority (Form PCT/ISA/237) of PCT/JP2022/026794," mailed on Aug. 9, 2022, pp. 1-5.

"Request for the Submission of an Opinion of Korea Counterpart Application", with English translation thereof, issued on Feb. 21, 2025, pp. 1-10.

* cited by examiner

*Primary Examiner* — Jiong-Ping Lu

(74) *Attorney, Agent, or Firm* — JCIPRNET

(57) ABSTRACT

Provided is a semiconductor etching solution having a large etching ratio of SiGe relative to Si when an object containing Si and SiGe is treated and having excellent storage stability. The semiconductor etching solution includes: a fluoride ion source; a carboxylic acid; a percarboxylic acid; hydrogen peroxide; and bromide ions, and a content of the bromide ions is less than 500 mass ppm with respect to a total mass of the semiconductor etching solution.

16 Claims, No Drawings

SEMICONDUCTOR ETCHING SOLUTION

CROSS-REFERENCE TO RELATED APPLICATIONS

This application is a Continuation of PCT International Application No. PCT/JP2022/026794 filed on Jul. 6, 2022, which claims priority under 35 U.S.C. § 119(a) to U.S. Patent Application No. 63/220,566 filed on Jul. 12, 2021. The above applications are hereby expressly incorporated by reference, in their entirety, into the present application.

BACKGROUND OF THE INVENTION

The present invention relates to a semiconductor etching solution.

In accordance with progress of miniaturization of a semiconductor device, there is an increasing demand for performing a treatment such as etching or cleaning performed using a processing liquid with high efficiency and high accuracy in a semiconductor device manufacturing process. For example, JP 2020-517108 A discloses a method of selectively removing silicon germanium relative to silicon using an aqueous etching composition containing hydrogen fluoride, dissolved hydrogen peroxide, dissolved acetic acid, dissolved formic acid, and dissolved sulfuric acid.

SUMMARY OF THE INVENTION

As a result of conducting studies on a semiconductor etching solution (aqueous etching composition) based on JP 2020-517108 A, the present inventors found that while it is possible to selectively etch a silicon germanium-containing material (hereinafter, also simply referred to as "SiGe") relative to a silicon-containing material (hereinafter, also simply referred to as "Si"), there is room for improvement in storage stability of the semiconductor etching solution.

In view of the above circumstances, the present invention aims at providing a semiconductor etching solution having a large etching ratio of SiGe relative to Si when an object containing Si and SiGe is treated and having excellent storage stability.

As a result of conducting intensive studies to solve the above problems, the present inventors found that the above problems can be solved by the following configuration.

[1] A semiconductor etching solution comprising:

a fluoride ion source;

a carboxylic acid;

a percarboxylic acid;

hydrogen peroxide; and bromide ions, wherein a content of the bromide ions is less than 500 mass ppm with respect to a total mass of the semiconductor etching solution.

[2] A semiconductor etching solution comprising:

a fluoride ion source;

a carboxylic acid;

a percarboxylic acid;

hydrogen peroxide;

at least one compound selected from the group consisting of N-(3-aminopropyl)diethanolamine, 3-morpholino-1,2-propanediol, and diisopropanolamine;

at least one compound selected from the group consisting of naphthalene sulfonic acid formalin condensate, methanesulfonic acid, C12 to C14 alkyldiphenyl ether disulfonic acid, and triisopropylnaphthalene sulfonic acid; and bromide ions, wherein a content of the bromide ions is less than 500 mass ppm with respect to a total mass of the semiconductor etching solution.

[3] The semiconductor etching solution according to [1] or [2], wherein the content of the bromide ions is 5 mass ppt or more with respect to the total mass of the semiconductor etching solution.

[4] The semiconductor etching solution according to any one of [1] to [3], wherein a mass ratio of a content of the carboxylic acid to the content of the bromide ions is $1.0\times10^{10}$ or more.

[5] A semiconductor etching solution comprising:

a fluoride ion source;

a carboxylic acid;

a percarboxylic acid; and hydrogen peroxide, wherein a content of the carboxylic acid, a content of the percarboxylic acid, and a content of the hydrogen peroxide are 55.0 to 94.0% by mass, 5.0 to 25.0% by mass, and 1.0 to 20.0% by mass, respectively, with respect to a total mass of the carboxylic acid, the percarboxylic acid, and the hydrogen peroxide.

[6] A semiconductor etching solution comprising:

a fluoride ion source;

a carboxylic acid;

a percarboxylic acid; and hydrogen peroxide, at least one compound selected from the group consisting of N-(3-aminopropyl)diethanolamine, 3-morpholino-1,2-propanediol, and diisopropanolamine;

at least one compound selected from the group consisting of naphthalene sulfonic acid formalin condensate, methanesulfonic acid, C12 to C14 alkyldiphenyl ether disulfonic acid, and triisopropylnaphthalene sulfonic acid; and wherein a content of the carboxylic acid, a content of the percarboxylic acid, and a content of the hydrogen peroxide are 55.0 to 94.0% by mass, 5.0 to 25.0% by mass, and 1.0 to 20.0% by mass, respectively, with respect to a total mass of the carboxylic acid, the percarboxylic acid, and the hydrogen peroxide.

[7] The semiconductor etching solution according to any one of [1] to [6], wherein the carboxylic acid is acetic acid, and the percarboxylic acid is peracetic acid.

[8] The semiconductor etching solution according to any one of [1] to [7], wherein the fluoride ion source is hydrogen fluoride.

[9] The semiconductor etching solution according to any one of [1] to [8], further comprising bromate ions, wherein a content of the bromate ions is 1 to 100 mass ppm with respect to the total mass of the semiconductor etching solution.

[10] The semiconductor etching solution according to any one of [1] to [9], wherein an alcohol-based solvent is not contained.

[11] The semiconductor etching solution according to any one of [1] to [10], further comprising sulfuric acid.

[12] The semiconductor etching solution according to any one of [1] to [11], further comprising an organic compound having a sulfonic acid group.

[13] The semiconductor etching solution according to [12], wherein the organic compound having a sulfonic acid group is a polymer having a repeating unit having a sulfonic acid group.

[14] The semiconductor etching solution according to any one of [1] to [13], further comprising an amine.

[15] The semiconductor etching solution according to any one of [1] to [14], further comprising a metallic impurity component including one or more elements selected from the group consisting of Mn, Ni, V, Co, Fe, and Cr, wherein a content of each of the elements included in the metallic impurity component is less than 1.0 mass ppb with respect to the total mass of the semiconductor etching solution.

[16] The semiconductor etching solution according to any one of [1] to [15], wherein a mass ratio of a content of the percarboxylic acid to a total content of the elements included in the metallic impurity component is $2.0\times10^9$ or more.

[17] The semiconductor etching solution according to any one of [1] to [16], wherein a mass ratio of a content of the fluoride ion source to a total content of the elements included in the metallic impurity component is $2.0\times10^7$ or more.

[18] A process for manufacturing a semiconductor device, using the semiconductor etching solution according to any one of [1] to [17].

[19] A semiconductor device manufactured by the prosess for manufacturing a semiconductor device according to [18].

According to the present invention, it is possible to provide a semiconductor etching solution having a large etching ratio of SiGe relative to Si when an object containing Si and SiGe is treated and also having excellent storage stability.

DESCRIPTION OF THE PREFERRED EMBODIMENTS

Hereinafter, the present invention will be described in detail.

The following constituents may be described based on typical embodiments of the present invention in some cases, but the present invention is not limited to the embodiments.

Hereinafter, the meaning of each description in the present specification will be described. In the present specification, a range of numerical values indicated using “to” means a range including numerical values described before and after “to” as a lower limit value and an upper limit value.

In the present specification, “ppm” is an abbreviation for “parts per million” and means $10^{-6}$. In addition, “ppb” is an abbreviation for “parts per billion” and means $10^{-9}$. “ppt” is an abbreviation for “parts per trillion” and means $10^{-12}$.

In the present specification, the “silicon-containing material” refers to a material substantially formed of only a Si element. “Substantially” means that a content of the Si element is 90 atomic % or more with respect to all atoms of the material. Therefore, as long as the content of the Si element is within the above range, other elements (excluding a Ge element) may be contained.

In addition, in the present specification, the “silicon germanium-containing material” refers to a material substantially formed of only a Si element and a Ge element. “Substantially” means that a total content of the Si element and the Ge element is 90 atomic % or more with respect to all atoms of the material. Therefore, as long as the total content of the Si element and the Ge element is within the above range, other elements may be contained. In addition, in silicon germanium, a ratio of the content of the Si element to the content of the Ge elements is not particularly limited, but it is preferable that the content of the Ge element is 10 to 70 atomic % with respect to the total amount of the Si element and the Ge element.

{Semiconductor Etching Solution}

A semiconductor etching solution according to each of a first embodiment and a second embodiment of the present invention (hereinafter, also simply referred to as an “etching solution”) will be described. Specifically, hereinafter, the respective components and optional components of the etching solutions according to the first embodiment and the second embodiment, a method of preparing an etching solution, an etching solution containing body, and a method of providing the etching solution will be described.

The etching solution according to the first embodiment is an etching solution containing a fluoride ion source, a carboxylic acid, a percarboxylic acid, hydrogen peroxide, and bromide ions, in which a content of the bromide ions is less than 500 mass ppm with respect to a total mass of the etching solution.

The etching solution according to the second embodiment is an etching solution containing a fluoride ion source, a carboxylic acid, a percarboxylic acid, and hydrogen peroxide, in which a content of the carboxylic acid, a content of the percarboxylic acid, and a content of the hydrogen peroxide are 55.0 to 94.0% by mass, 5.0 to 25.0% by mass, and 1.0 to 15.0% by mass, respectively, with respect to a total mass of the percarboxylic acid, the carboxylic acid, and the hydrogen peroxide.

Hereinafter, when at least one of the larger etching ratio of SiGe relative to Si and the more excellent storage stability of the etching solution is met, it is also described as that “the effects of the present invention are more excellent”.

Components: First Embodiment

Hereinafter, components contained in the etching solution according to the first embodiment will be described.

The etching solution according to the first embodiment of the present invention contains a fluoride ion source, a carboxylic acid, a percarboxylic acid, hydrogen peroxide, and bromide ions, in which a content of the bromide ions is less than 500 mass ppm with respect to the total mass of the etching solution.

Fluoride Ion Source: First Embodiment

The etching solution according to the first embodiment of the present invention contains a fluoride ion source.

The fluoride ion source is a component that releases fluoride ions in the etching solution. Examples of the fluoride ions can include ions containing fluorine atoms such as $F^-$ and $HF_2^-$. The present inventors presume that although the mechanism is not clear, the etching solution contains the fluoride ions, thereby exhibiting ability to etch SiGe.

Examples of the fluoride ion source can include hydrogen fluoride (HF) (hydrogen fluoride may be used as hydrofluoric acid (HF aqueous solution)), hexafluorophosphoric acid ($HPF_6$), hexafluorosilicic acid ($H_2SiF_6$), tetrafluoroboric acid ($HBF_4$), and salts thereof. In addition, bifluoride ions ($HF_2^-$) or a component that releases fluoride-containing ions (for example, $MF_6^{n-}$, M: arbitrary atom, n: 1 to 3) may be used as the fluoride ion source.

Examples of a counter cation constituting a salt can include an alkali metal ion, an ammonium cation, a quaternary ammonium cation, a sulfonium cation, and an iodonium cation.

Specific examples of the salt of the hydrogen fluoride can include lithium fluoride (LiF), sodium fluoride (NaF), potassium fluoride (KF), ammonium fluoride ($NH_4F$), tetra-n-butyl ammonium fluoride ($N(C_4H_9)_4F$), and tetramethylammonium fluoride ($N(CH_3)_4F$).

Specific examples of the salt of the hexafluorophosphoric acid can include lithium hexafluorophosphate ($LiPF_6$), sodium hexafluorophosphate ($NaPF_6$), potassium hexafluorophosphate ($KPF_6$), ammonium hexafluorophosphate ($NH_4PF_6$), and tetra-n-butylammonium hexafluorophosphate ($N(C_4H_9)_4PF_6$).

Specific examples of the salt of the hexafluorosilicic acid can include sodium hexafluorosilicate ($Na_2SiF_6$), potassium hexafluorosilicate ($K_2SiF_6$), and ammonium hexafluorosilicate ($(NH_4)_2SiF_6$).

Specific examples of the salt of the tetrafluoroboric acid can include lithium tetrafluoroborate ($LiBF_4$), sodium tetrafluoroborate ($NaBF_4$), potassium tetrafluoroborate ($KBF_4$), and ammonium tetrafluoroborate ($NH_4BF_4$).

Specific examples of the component that releases bifluoride ions can include sodium bifluoride ($NaHF_2$), potassium bifluoride ($KHF_2$), and ammonium bifluoride ($NH_4HF_2$).

Specific examples of the component that releases fluoride-containing ions can include sodium hexafluoroaluminate ($Na_3AlF_6$), 2-ammonium hexafluorotitanate ($(NH_4)_2TiF_6$), potassium hexafluoroniobate ($KNbF_6$), and sodium hexafluoroantimonate ($NaSbF_6$).

Among the examples, the fluoride ion source is preferably hydrogen fluoride, hexafluorophosphoric acid, or hexafluorosilicic acid, and more preferably hydrogen fluoride in terms of more excellent effects of the present invention.

The content of the fluoride ion source in the etching solution according to the first embodiment is not particularly limited, but is preferably 0.05 to 1.0% by mass, more preferably 0.1 to 0.5% by mass, and still more preferably 0.1 to 0.4% by mass, with respect to a total mass of the etching solution, in terms of a moderately excellent etching speed of SiGe.

The fluoride ion sources may be used alone or in combination of two or more thereof. In a case where two or more fluoride ion sources are used, the total amount thereof is preferably within the above range.

Carboxylic Acid: First Embodiment

The etching solution according to the first embodiment of the present invention contains a carboxylic acid.

Since the etching solution contains both the carboxylic acid and hydrogen peroxide described below, a percarboxylic acid described below is generated.

In the present specification, the carboxylic acid is an organic compound having a carboxylic group.

The number of carboxylic groups included in the carboxylic acid is not particularly limited, but may be 1 or more, preferably 1 to 4, more preferably 1 to 3, and still more preferably 1 or 2.

Examples of the carboxylic acid can include a carboxylic acid having an aliphatic group and a carboxylic acid having an aromatic group.

Examples of the aliphatic group in the above-described carboxylic acid having an aliphatic group can include an alkyl group, an alkenyl group, and an alkynyl group. The aliphatic group may be a linear, branched, or cyclic aliphatic group.

The number of carbons of the aliphatic group is preferably 1 to 10 and more preferably 1 to 6.

In addition, the aliphatic group may have a substituent in addition to the carboxylic group.

The substituent which may be included in the aliphatic group is not particularly limited, but examples thereof can include a hydroxyl group, a thiol group, a fluoro group, a chloro group, a bromo group, an iodo group, an amino group, a nitro group, and a cyano group, in addition to the carboxylic group.

Part of $—CH_2—$ constituting the aliphatic group may be substituted with a divalent substituent. Examples of the divalent substituent substituted for part of the $—CH_2—$ can include —O—, —S—, —CO—, —COO—, —OCO—, —NH—, $—NR^T—$, and $—SO_2—$. $R^T$ represents an alkyl group.

The aliphatic group is preferably an alkyl group, and more preferably a linear alkyl group.

The aromatic group in the above-described carboxylic acid having an aromatic group only needs to have a structure exhibiting aromaticity, and examples thereof can include an aryl group, a heteroaryl group, and a group obtained by combining any of these groups and a non-aromatic group. The aromatic group may have a substituent in addition to the carboxylic group.

Examples of an aromatic ring constituting the aromatic group can include a benzene ring and a naphthalene ring.

The substituent which may be included in the aromatic group is the same as the substituent which may be included in the above-described alkyl group.

The number of carboxylic groups included in the aryl group is preferably 1 to 4, more preferably 1 or 2, and still more preferably 1.

Examples of the carboxylic acid can include formic acid, acetic acid, propionic acid, acrylic acid, butyric acid, valeric acid, lactic acid, malic acid, citric acid, oxalic acid, malonic acid, succinic acid, glutaric acid, adipic acid, fumaric acid, maleic acid, aconitic acid, nitrilotriacetic acid, ethylenediaminetetraacetic acid, 1,3-propanediaminetetraacetic acid, glycol ether diamine tetraacetic acid, cyclohexanediaminetetraacetic acid, triethylenetetraminehexacetic acid, taurine diacetic acid, methylglycine diacetic acid, glutamic diacetic acid, trifluoroacetic acid, chloroacetic acid, benzoic acid, p-chlorobenzoic acid, o-chlorobenzoic acid, m-chlorobenzoic acid, phthalic acid, isophthalic acid, terephthalic acid, trimesic acid, mellitic acid, and salicylic acid.

Among them, formic acid, acetic acid, trifluoroacetic acid, benzoic acid, m-chlorobenzoic acid, or phthalic acid is preferable, acetic acid or m-chlorobenzoic acid is more preferable, and acetic acid is still more preferable, in terms of more excellent effects of the present invention.

The content of the carboxylic acid in the etching solution according to the first embodiment is not particularly limited, but is preferably 30.0 to 80.0% by mass, more preferably 40.0 to 70.0% by mass, and still more preferably 50.0 to 65.0% by mass, with respect to a total mass of the etching solution, in terms of more excellent effects of the present invention.

The carboxylic acids may be used alone or in combination of two or more thereof. In a case where two or more carboxylic acids are used, the total amount thereof is preferably within the above range.

Hydrogen Peroxide: First Embodiment

The etching solution according to the first embodiment of the present invention contains hydrogen peroxide.

Since the etching solution contains both the carboxylic acid and the hydrogen peroxide, a percarboxylic acid described below is generated.

The hydrogen peroxide to be used may be in the form of hydrogen peroxide water in terms of safety and easiness in availability.

The content of the hydrogen peroxide in the etching solution according to the first embodiment is not particularly limited, but is preferably 1.0 to 10.0% by mass, more preferably 2.0 to 6.0% by mass, and still more preferably 2.5 to 5.0% by mass, with respect to a total mass of the etching solution, in terms of more excellent effects of the present invention.

Percarboxylic Acid: First Embodiment

The etching solution according to the first embodiment of the present invention contains a percarboxylic acid.

The present inventors presume that although the mechanism is not clear, since the etching solution contains both the carboxylic acid and the hydrogen peroxide, the percarboxylic acid is generated, and the generated percarboxylic acid concertedly acts with the fluoride ions, thereby increasing an etching ratio of SiGe relative to Si.

The percarboxylic acid is presumably generated through an equilibrium reaction of the following Formula (1) while the etching solution contains both the carboxylic acid and the hydrogen peroxide. In Formula (1), R represents a residue.

The percarboxylic acid may be separately added to the etching solution, as necessary.

[Chem. 1]

(1)

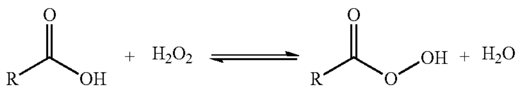

The percarboxylic acid corresponding to the carboxylic acid contained in the etching solution is generated in the etching solution. Examples of the percarboxylic acid can include performic acid, peracetic acid, perpropionic acid, peracrylic acid, perbutyric acid, perlactic acid, percitric acid, peroxalic acid, permalonic acid, persuccinic acid, perglutaric acid, peradipic acid, perfumaric acid, permaleic acid, trifluoroperacetic acid, chloroperacetic acid, perbenzoic acid, p-chloroperbenzoic acid, o-chloroperbenzoic acid, m-chloroperbenzoic acid, perphthalic acid, perisophthalic acid, perterephthalic acid, pertrimesic acid, permellitic acid, persalicylic acid, and percarboxylic acids corresponding to valeric acid, malic acid, aconitic acid, nitrilotriacetic acid, ethylenediaminetetraacetic acid, 1,3-propanediaminetetraacetic acid, glycol ether diamine tetraacetic acid, cyclohexanediaminetetraacetic acid, triethylenetetraminehexacetic acid, taurine diacetic acid, methylglycine diacetic acid, or glutamic diacetic acid.

A preferred percarboxylic acid is a percarboxylic acid generated from the above-described preferred carboxylic acid. Examples of the preferred percarboxylic acid can include performic acid, peracetic acid, trifluoroperacetic acid, perbenzoic acid, m-chloroperbenzoic acid, and perphthalic acid. Among them, peracetic acid or m-chloroperbenzoic acid is more preferable, and peracetic acid is still more preferable, in terms of more excellent effects of the present invention.

The preferred percarboxylic acid when the percarboxylic acid is separately added is the same as the preferred percarboxylic acid.

A method of quantifying the content of the percarboxylic acid may be a known method, and an example thereof is a titration method using manganese peroxide, potassium iodide, and sodium thiosulfate. Hereinafter, a specific procedure of the method will be described.

The etching solution to be quantified is made to have sulfuric acidity, and the hydrogen peroxide contained in the etching solution is titrated with potassium permanganate. Thereafter, potassium iodide is added to the etching solution to generate free iodine in an amount equal to that of the percarboxylic acid. The free iodine is titrated with sodium thiosulfate to determine an amount of percarboxylic acid. An end point of each titration can be monitored based on a change in oxidation-reduction potential of the solution.

In the present specification, the content of the percarboxylic acid is measured using the above titration.

The content of the percarboxylic acid in the etching solution according to the first embodiment is preferably 5.0 to 20.0% by mass, more preferably 8.0 to 15.0% by mass, and still more preferably 10.0 to 13.0% by mass, with respect to a total mass of the etching solution, in terms of more excellent effects of the present invention.

A mass ratio between the carboxylic acid, the percarboxylic acid, and the hydrogen peroxide contained in the etching solution according to the first embodiment is not particularly limited. However, the content of the carboxylic acid, the content of the percarboxylic acid, and the content of the hydrogen peroxide are preferably 55.0 to 94.0% by mass, 5.0 to 25.0% by mass, and 1.0 to 20.0% by mass, respectively, with respect to the total mass of the carboxylic acid, the percarboxylic acid, and the hydrogen peroxide, and the content of the carboxylic acid, the content of the percarboxylic acid, and the content of the hydrogen peroxide are more preferably 70.0 to 89.0% by mass, 10.0 to 20.0% by mass, and 1.0 to 10.0% by mass, respectively, with respect to the total mass of the carboxylic acid, the percarboxylic acid, and the hydrogen peroxide, in terms of more excellent effects of the present invention.

The percarboxylic acids may be used alone or in combination of two or more thereof. In a case where two or more percarboxylic acids are used, the total amount thereof is preferably within the above range.

Bromide Ion: First Embodiment

The etching solution according to the first embodiment of the present invention contains bromide ions. A content of the bromide ions is less than 500 mass ppm with respect to the total mass of the etching solution.

The present inventors presume that although the mechanism is not clear, since the etching solution contains the bromide ions in an amount of less than 500 mass ppm with respect to the total mass of the etching solution, storage stability is excellent. Further, the present inventors presume that a surface roughness of SiGe after the etching treatment becomes small due to affinity of the bromide ions with Ge.

The content of the bromide ions in the etching solution according to the first embodiment is preferably 10 mass ppm or less, more preferably 10 mass ppb or less, and still more preferably 100 mass ppt or less, with respect to the total mass of the etching solution, in terms of more excellent effects of the present invention.

In addition, a lower limit of the content of the bromide ions is preferably 1 mass ppt or more, and more preferably 5 mass ppt or more, with respect to the total mass of the etching solution, in terms of small surface roughness of SiGe.

An example of a method of supplying the bromide ions to the etching solution can include a method in which a compound containing bromide ions (bromide ion source) is added to the etching solution.

Examples of the bromide ion source can include bromide and a salt consisting of a bromide ion and a cation. An example of the bromide can include hydrobromic acid (HBr aqueous solution).

Examples of the salt consisting of a bromide ion and a cation can include a salt consisting of an alkali metal ion and a bromide ion, a salt consisting of an alkaline earth metal ion and a bromide ion, and a salt consisting of a basic compound ion and a bromide ion.

Examples of the salt consisting of an alkali metal ion and a bromide ion can include lithium bromide, sodium bromide, and potassium bromide.

Examples of the salt consisting of an alkaline earth metal ion and a bromide ion can include magnesium bromide, calcium bromide, and strontium bromide.

Examples of the salt consisting of a basic compound ion and a bromide ion can include ammonium bromide, methylammonium bromide, ethylammonium bromide, diethylammonium bromide, triethylammonium bromide, tetraethylammonium bromide, and tetrabutylammonium bromide.

A method of measuring the content of the bromide ions may be a known method, and an example thereof includes a method using ion chromatography. In the present specification, the content of the bromide ions represents a method measured using ion chromatography.

More specifically, analysis is performed using an ion chromatograph (Dionex ICS-6000).

When a bromide ion is not detected using the above-mentioned device, the etching solution is concentrated using Dionex (registered trademark) IonPac (registered trademark) AC15 concentration column to detect a bromide ion. When a bromide ion is not detected by this concentration operation, the content of the bromide ions is set to 0.

A mass ratio of the content of the carboxylic acid to the content of the bromide ions is not particularly limited, but is often $1.0\times10^{8}$ or more, and is preferably $1.0\times10^{10}$ or more, in terms of more excellent effects of the present invention. An upper limit of the mass ratio of the content of the carboxylic acid to the content of the bromide ions is not particularly limited, but is preferably $1.0\times10^{11}$ or less, in terms of small surface roughness of SiGe.

Optional Components and Others: First Embodiment

Hereinafter, optional components which may be contained in the etching solution according to the first embodiment will be described.

Examples of the optional components which may be contained in the etching solution according to the first embodiment of the present invention can include a solvent, a bromate ion, sulfuric acid, a compound containing sulfonic acid, an amine, and a metallic impurity.

Solvent: First Embodiment

The etching solution according to the first embodiment of the present invention may contain a solvent.

The solvent is not particularly limited as long as it can dissolve the above components and optional components, but examples thereof can include water and an organic solvent.

Examples of the organic solvent can include an alcohol-based solvent, an ether-based solvent, a ketone-based solvent, an ester-based solvent, a sulfone-based solvent, a sulfoxide-based solvent, a nitrile-based solvent, and an amide-based solvent.

It is preferable that the etching solution according to the first embodiment does not contain an alcohol-based solvent. Examples of the alcohol-based solvent can include methanol, ethanol, propanol, and propylene glycol. As described below, an amine is not included in the alcohol-based solvent. More specifically, an alkanol-amine is not included in the alcohol-based solvent.

The present inventors presume that although the mechanism is not clear, since the etching solution does not contain the alcohol-based solvent, a reduction in hydrogen peroxide and/or percarboxylic acid is suppressed and storage stability is improved.

The solvent is preferably water and more preferably ultrapure water.

A content of the solvent in the etching solution according to the first embodiment is not particularly limited, but is preferably 15.0 to 70.0% by mass, more preferably 18.0 to 60.0% by mass, still more preferably 20.0 to 50.0% by mass, and particularly preferably 20.0 to 30.0% by mass, with respect to the total mass of the etching solution.

Bromate Ion: First Embodiment

The etching solution according to the first embodiment of the present invention may contain bromate ions.

The present inventors presume that since the etching solution contains bromate ions, decomposition of the hydrogen peroxide and/or the percarboxylic acid is suppressed and storage stability is improved.

When the bromate ions are added to the etching solution, a compound containing bromate ions may be added to the etching solution, or an aqueous solution of a compound containing bromate ions may be added to the etching solution.

Examples of the compound containing bromate ions can include a salt consisting of an alkali metal ion and a bromate ion, a salt consisting of an alkaline earth metal and a bromate ion, a salt consisting of a basic compound ion and a bromate ion, and bromic acid ($HBrO_3$).

Examples of the salt consisting of an alkali metal ion and a bromate ion can include sodium bromate and potassium bromate.

Examples of the salt consisting of an alkaline earth metal and a bromate ion can include calcium bromate and strontium bromate.

An example of the salt consisting of a basic compound ion and a bromate ion can include ammonium bromate.

The compounds containing bromate ions can be used in combination of two or more thereof.

A content of the bromate ions in the etching solution according to the first embodiment is not particularly limited, but is often 100 mass ppb to 500 mass ppm, and is preferably 1 to 100 mass ppm, and more preferably 50 to 100 mass ppm, with respect to the total mass of the etching solution, in terms of more excellent effects of the present invention.

Sulfuric Acid: First Embodiment

The etching solution according to the first embodiment of the present invention may contain sulfuric acid.

The present inventors presume that although the mechanism is not clear, since the etching solution contains the sulfuric acid, the carboxylic acid, the hydrogen peroxide, and/or the percarboxylic acid concertedly act with each other, thereby increasing the etching ratio of SiGe relative to Si.

A content of the sulfuric acid in the etching solution according to the first embodiment is not particularly limited, but is preferably 0.01 to 2.0% by mass, and more preferably 0.1 to 1.0% by mass, with respect to the total mass of the etching solution.

Organic Compound Having Sulfonic Acid Group: First Embodiment

The etching solution according to the first embodiment of the present invention may contain an organic compound having a sulfonic acid group.

The present inventors presume that although the mechanism is not clear, since the etching solution contains the organic compound having a sulfonic acid group, the carboxylic acid, the hydrogen peroxide, and/or the percarboxylic acid concertedly act with each other, thereby increasing the etching ratio of SiGe relative to Si.

The organic compound having a sulfonic acid group in the etching solution according to the first embodiment is not particularly limited, but examples thereof can include alkyl sulfonic acid, aryl sulfonic acid, and salts thereof. In addition, the organic compound having a sulfonic acid group may be a polymer having a repeating unit having the sulfonic acid group, or may be a salt thereof.

Examples of a cation constituting the salt of the sulfonic acid can include a lithium ion, a sodium ion, a potassium ion, and an ammonium cation.

The alkyl group in the alkyl sulfonic acid may be a linear or branched alkyl group and may have a substituent. Examples of the substituent which may be included in the alkyl group can include a halogen atom, a cyano group, an amino group, and a hydroxyl group. The number of carbons of the alkyl group is preferably 1 to 20, more preferably 1 to 6, and still more preferably 1.

Examples of the alkyl sulfonic acid can include methanesulfonic acid, trifluoromethanesulfonic acid, ethanesulfonic acid, 1-propanesulfonic acid, 2-propanesulfonic acid, and dodecylsulfonic acid. Among them, methanesulfonic acid is preferable.

The aryl group in the aryl sulfonic acid only needs to have a group exhibiting aromaticity, or may be a combination of an alkyl group and a group exhibiting aromaticity.

Examples of the aryl group can include a phenyl group, a naphthyl group, and a biphenyl group. Examples of the aryl sulfonic acid can include benzene sulfonic acid, 2-naphthalene sulfonic acid, p-toluene sulfonic acid, dodecylbenzene sulfonic acid, dipropylnaphthalene sulfonic acid, triisopropylnaphthalene sulfonic acid, dodecyl diphenyl ether disulfonic acid, and tetradecyl diphenyl ether disulfonic acid. Among them, p-toluene sulfonic acid, dodecylbenzene sulfonic acid, triisopropylnaphthalene sulfonic acid, dodecyl diphenyl ether disulfonic acid, or tetradecyl diphenyl ether disulfonic acid is preferable.

An example of the polymer having a repeating unit having a sulfonic acid group can include a polymer having a repeating unit having a group derived from the alkyl sulfonic acid and/or a group derived from the aryl sulfonic acid.

The polymer may have a repeating unit which does not have a sulfonic acid group.

A weight average molecular weight of the polymer is preferably 400 to 50,000.

Examples of the polymer having a repeating unit having a sulfonic acid group can include a formaldehyde condensate of benzene sulfonic acid and a formaldehyde condensate of naphthalene sulfonic acid.

As the organic compound having a sulfonic acid group, a sulfonic acid-based surfactant is also preferable.

Examples of the sulfonic acid-based surfactant can include a formalin condensate of aryl sulfonic acid, such as alkylbenzene sulfonic acid, alkylnaphthalene sulfonic acid, alkyldiphenyl ether disulfonic acid, polyoxyalkylene alkyl ether sulfonic acid, styrene sulfonic acid, or phenol sulfonic acid, and a salt thereof (a lithium salt, a sodium salt, a potassium salt, or an ammonium salt).

A content of the organic compound having a sulfonic acid group in the etching solution according to the first embodiment is not particularly limited, but is preferably 0.001 to 1.0% by mass, and more preferably 0.01 to 0.5% by mass, with respect to the total mass of the etching solution.

The organic compounds having a sulfonic acid group may be used alone or in combination of two or more thereof. In a case where two or more organic compounds having a sulfonic acid group are used, the total amount thereof is preferably within the above range.

Amine: First Embodiment

The etching solution according to the first embodiment of the present invention may contain an amine.

The present inventors presume that although the mechanism is not clear, since the etching solution contains the compound having an amine, the fluoride ion source, the carboxylic acid, the hydrogen peroxide, and/or the percarboxylic acid concertedly act with each other, thereby increasing the etching ratio of SiGe relative to Si.

In the present specification, the amine refers to a compound in which one or more hydrogen atoms of ammonia are substituted with a hydrocarbon group which may have a substituent.

However, even though the hydrocarbon group has a hydroxyl group as a substituent, the compound is not included in the alcohol-based solvent. That is, the etching solution may contain an amine having a hydroxyl group.

Examples of the hydrocarbon group which may have a substituent can include an alkyl group which may have a substituent and an aryl group which may have a substituent.

The alkyl group which may have a substituent may be a linear or branched alkyl group. The number of carbons of the alkyl group is preferably 1 to 10 and more preferably 1 to 3. Examples of the substituent which may be included in the alkyl group can include a halogen atom, a cyano group, an amino group ($-NH_2$), and a hydroxyl group. Among them, an amino group or a hydroxyl group is preferable.

Examples of the alkyl group which may have a substituent can include a methyl group, an ethyl group, a propyl group, a 2-hydroxyethyl group, a 2-hydroxypropyl group, a 2,3-hydroxypropyl group, a 2-aminoethyl group, and a 3-aminopropyl group.

In a case where the number of alkyl groups in the amine is two or more, two alkyl groups may be bonded to form a ring so as to form a cyclic amine. The cyclic amine may or may not exhibit aromaticity. Examples of the cyclic amine to be formed can include a pyrrolidine ring, a piperidine ring, a morpholine ring, a pyrrole ring, and a pyridine ring. Among them, a morpholine ring is preferable.

Examples of the aryl group which may have a substituent can include a phenyl group, a naphthyl group, a furyl group, a pyrrolyl group, a p-hydroxyphenyl group, and a p-chlorophenyl group.

Examples of the amine can include methylamine, dimethylamine, trimethylamine, ethylamine, ethanolamine, diethylamine, diethanolamine, propylamine, diisopropanolamine, N-(3-aminopropyl) diethanolamine, morpholine, and 3-morpholino-1,2-propanediol. Among them, diisopropanolamine, N-(3-aminopropyl) diethanolamine, or 3-morpholino-1,2-propanediol is preferable.

A content of the amine in the etching solution according to the first embodiment is not particularly limited, but is preferably 0.01 to 1% by mass, and more preferably 0.02 to 0.1% by mass, with respect to the total mass of the etching solution.

The amines may be used alone or in combination of two or more thereof. In a case where two or more amines are used, the total amount thereof is preferably within the above range.

Metallic Impurity: First Embodiment

The etching solution according to the first embodiment of the present invention may further contain a metallic impurity component including one or more elements (hereinafter, referred to as "specific elements") selected from the group consisting of Mn, Ni, V, Co, Fe, and Cr.

A content of each of the elements included in the metallic impurity component is preferably less than 1.0 mass ppb with respect to the total mass of the etching solution. That is, the content of each of the specific elements is preferably less than 1.0 mass ppb.

A lower limit of the content of each of the elements is not particularly limited, but may be 1 mass ppt or more or may not be detected.

The present inventors presume that although the mechanism is not clear, since the content of each of the elements included in the metallic impurity component is less than 1.0 mass ppb with respect to the total mass of the etching solution, decomposition of the hydrogen peroxide and/or the percarboxylic acid is suppressed and storage stability is improved.

The metallic impurity component may be in a form of metal particles and metal ions.

The metallic impurity component may have one specific element or two or more specific elements.

The metal particles may be simple particles or an alloy and may be in a form of an aggregate of a metal and an organic substance.

The content of each of the specific elements in the metallic impurity component in the etching solution can be measured by single nano particle-inductively coupled plasma mass spectrometry (SP-ICP-MS).

Here, the SP-ICP-MS is performed using the same device as in the general inductively coupled plasma mass spectrometry (ICP-MS), and differs in only data analysis. The data analysis of the SP-ICP-MS can be performed using a commercially available software.

As a measurement method of the SP-ICP-MS, a measurement method described in Examples can be carried out using Agilent 8800 triple quadrupole inductively coupled plasma mass spectrometry (ICP-MS, for semiconductor analysis, option #200) manufactured by Agilent Technologies, Inc. As other devices, NexION350S manufactured by PerkinElmer Inc. and Agilent 8900 manufactured by Agilent Technologies, Inc. can also be used.

When the content of the specific element cannot be detected in the above-mentioned measurement, the etching solution is concentrated, and then, the above-mentioned measurement is performed. When the specific element is not detected after the concentration, the content thereof is set to 0.

In the operation of the above-mentioned concentration, first, ammonia water is added to the etching solution, and the pH is adjusted to 6 to 8, and the mixture is left at room temperature for one weeks. Next, the obtained etching solution is heated to 100° C., and concentrated 100 times.

A mass ratio of the content of the fluoride ion source to a total content of the specific elements included in the metallic impurity component is not particularly limited, but is often $1.0\times10^{6}$ or more, and is preferably $2.0\times10^{7}$ or more, in terms of more excellent effects of the present invention. An upper limit thereof is not particularly limited, but is preferably $1.0\times10^{10}$ or less and more preferably $1.0\times10^{9}$ or less.

A mass ratio of the content of the percarboxylic acid to the total content of the specific elements included in the metallic impurity component is not particularly limited, but is often $1.0\times10^{8}$ or more, and is preferably $2.0\times10^{9}$ or more, in terms of more excellent effects of the present invention. An upper limit thereof is not particularly limited, but is preferably $1.0\times10^{10}$ or less.

Other Components: First Embodiment

The etching solution according to the first embodiment may contain other components.

Examples of the other components which may be contained in the etching solution according to the first embodiment can include an oxidant and a surfactant.

Examples of the oxidant can include nitric acid, peroxide, persulfide (monopersulfide, dipersulfide, or the like), percarbonate, oxidized halide (iodic acid, periodic acid, or the like), perboric acid, permanganate, a molybdenum compound, a cerium compound, ferricyanide, and acids or salts thereof. However, the percarboxylic acid is not included in peroxide.

Examples of the surfactant can include an anionic surfactant, a nonionic surfactant, a cationic surfactant, and an amphoteric surfactant. The organic compound having a sulfonic acid group is not included in the surfactant.

The etching solution according to a preferred example of the first embodiment comprises: a fluoride ion source;

a carboxylic acid;

a percarboxylic acid;

hydrogen peroxide;

at least one compound selected from the group consisting of N-(3-aminopropyl)diethanolamine, 3-morpholino-1, 2-propanediol, and diisopropanolamine;

at least one compound selected from the group consisting of naphthalene sulfonic acid formalin condensate, methanesulfonic acid, C12 to C14 alkyldiphenyl ether disulfonic acid, and triisopropylnaphthalene sulfonic acid; and bromide ions, wherein a content of the bromide ions is less than 500 mass ppm with respect to a total mass of the semiconductor etching solution.

Components: Second Embodiment

Hereinafter, components contained in an etching solution according to a second embodiment will be described.

The etching solution according to the second embodiment of the present invention contains a fluoride ion source, a carboxylic acid, a percarboxylic acid, and hydrogen peroxide, in which a content of the carboxylic acid, a content of the percarboxylic acid, and a content of the hydrogen peroxide are 55.0 to 94.0% by mass, 5.0 to 25.0% by mass, and 1.0 to 20.0% by mass, respectively, with respect to a total mass of the carboxylic acid, the percarboxylic acid, and the hydrogen peroxide.

The etching solution according to the second embodiment of the present invention satisfies the same configuration as that of the etching solution according to the first embodiment of the present invention, except that the bromide ion is not an essential component and the carboxylic acid, the percarboxylic acid, and the hydrogen peroxide satisfy a predetermined mass relationship.

Fluoride Ion Source: Second Embodiment

The etching solution according to the second embodiment of the present invention contains a fluoride ion source.

The fluoride ion source is the same as the fluoride ion source described in the first embodiment, and preferred aspects thereof (for example, the type of the fluoride ion source, and the content of the fluoride ion source in the etching solution) are the same as those in the first embodiment.

Carboxylic Acid: Second Embodiment

The etching solution according to the second embodiment of the present invention contains a carboxylic acid.

The carboxylic acid is the same as the carboxylic acid described in the first embodiment, and preferred aspects thereof (for example, the type of the carboxylic acid, and the content of the carboxylic acid in the etching solution) are the same as those in the first embodiment.

Hydrogen Peroxide: Second Embodiment

The etching solution according to the second embodiment of the present invention contains hydrogen peroxide.

The hydrogen peroxide is the same as the hydrogen peroxide described in the first embodiment, and preferred aspects thereof (for example, the content of the hydrogen peroxide in the etching solution) are the same as those in the first embodiment.

Percarboxylic Acid: Second Embodiment

The etching solution according to the second embodiment of the present invention contains a percarboxylic acid.

The percarboxylic acid is the same as the percarboxylic acid described in the first embodiment, and preferred aspects thereof (for example, the type of the percarboxylic acid, and the content of the percarboxylic acid in the etching solution) are the same as those in the first embodiment.

Mass Ratio between Carboxylic Acid, Percarboxylic Acid, and Hydrogen Peroxide: Second Embodiment As for a mass ratio between the carboxylic acid, the percarboxylic acid, and the hydrogen peroxide contained in the etching solution according to the second embodiment, the content of the carboxylic acid, the content of the percarboxylic acid, and the content of the hydrogen peroxide are 55.0 to 94.0% by mass, 5.0 to 25.0% by mass, and 1.0 to 20.0% by mass, respectively, with respect to the total mass of the carboxylic acid, the percarboxylic acid, and the hydrogen peroxide.

In particular, in terms of more excellent effects of the present invention, the content of the carboxylic acid, the content of the percarboxylic acid, and the content of the hydrogen peroxide are preferably 70.0 to 89.0% by mass, 10.0 to 20.0% by mass, and 1.0 to 10.0% by mass, respectively, with respect to the total mass of the carboxylic acid, the percarboxylic acid, and the hydrogen peroxide, and the content of the carboxylic acid, the content of the percarboxylic acid, and the content of the hydrogen peroxide are more preferably 75.0 to 85.0% by mass, 12.0 to 17.5% by mass, and 3.0 to 7.5% by mass, respectively, with respect to the total mass of the carboxylic acid, the percarboxylic acid, and the hydrogen peroxide.

Optional Components and Others: Second Embodiment

Hereinafter, optional components that may be contained in the etching solution according to the second embodiment will be described.

Examples of the optional components which may be contained in the etching solution according to the second embodiment of the present invention can include a solvent, a bromide ion, a bromate ion, sulfuric acid, a compound containing sulfonic acid, an amine, and a metallic impurity.

The components are the same as those described in the first embodiment, and preferred aspects thereof (type, content, and the like) are also the same as those in the first embodiment.

As in the first embodiment, the etching solution according to the second embodiment may contain bromide ions, and a content of the bromide ions is preferably less than 500 mass ppm with respect to the total mass of the etching solution. A preferred range of the content of the bromide ions is the same as the preferred range described in the first embodiment.

The etching solution according to a preferred example of the second embodiment comprises:

a fluoride ion source;

a carboxylic acid;

a percarboxylic acid; and hydrogen peroxide, at least one compound selected from the group consisting of N-(3-aminopropyl)diethanolamine, 3-morpholino-1,2-propanediol, and diisopropanolamine;

at least one compound selected from the group consisting of naphthalene sulfonic acid formalin condensate, methanesulfonic acid, C12 to C14 alkyldiphenyl ether disulfonic acid, and triisopropylnaphthalene sulfonic acid;

wherein a content of the carboxylic acid, a content of the percarboxylic acid, and a content of the hydrogen peroxide are 55.0 to 94.0% by mass, 5.0 to 25.0% by mass, and 1.0 to 20.0% by mass, respectively, with respect to a total mass of the carboxylic acid, the percarboxylic acid, and the hydrogen peroxide.

(Method of Preparing Semiconductor Etching Solution)

A method of preparing the etching solution (each of the first embodiment and the second embodiment) is not particularly limited, but a known preparation method can be used. For example, when the etching solution according to the first embodiment is prepared, a method in which a fluoride ion source, a carboxylic acid, hydrogen peroxide, and a bromide ion source in predetermined amounts are mixed is exemplified. When mixing the components, an optional component such as water may be also mixed, as necessary.

In addition, when preparing the etching solution, a filtration treatment with a filter may be performed, as necessary.

The filtration treatment may be performed on a raw material or the etching solution having been mixed.

(Semiconductor Etching Solution Containing Body and Method of Providing Semiconductor Etching Solution)

The etching solution (each of the first embodiment and the second embodiment) may be contained in a container and stored until it is used.

Such a container and the etching solution contained in the container are together called an etching solution containing body. The etching solution is taken out from the stored etching solution containing body and used. In addition, the etching solution containing body may be transported so as to provide the etching solution, for example, from a manufacturer to a user or from a storage place to a place of use.

It is also preferable that the container has a degassing mechanism for adjusting a pressure in the container (internal pressure). The degassing mechanism is, for example, a mechanism for discharging gas from the inside to the outside of the container to prevent an excessive increase in internal pressure, thereby keeping the internal pressure within a certain range, when gas is generated from the etching solution due to an increase in temperature of the etching solution inside the container and/or decomposition of part of the components of the etching solution during storage of the etching solution containing body.

Examples of the degassing mechanism can include a check valve and a degassing cap provided with a degassing mechanism.

In addition, from the viewpoint of convenience in handling the etching solution, it is preferable that the etching solution is provided from, for example, a manufacturer to a user or from a storage place to a place of use by a method using such an etching solution containing body.

It is preferable that the container (in particular, a container body) has a high degree of cleanliness in the container with impurities being hardly eluted for semiconductor use. Examples of a usable container can include a "clean bottle" series manufactured by AICELLO CHEMICAL CO., LTD. and a "Pure bottle" manufactured by KODAMA PLASTICS Co., Ltd.

It is preferable that an inner wall of the container (in particular, the container body) is formed of one or more resins selected from a polyethylene resin, a polypropylene resin, and a polyethylene-polypropylene resin, or a resin different from these resins.

A fluororesin (perfluororesin) is preferable as the different resin. Since the container whose inner wall is formed of a fluororesin is used, it is possible to suppress occurrence of a defect, i.e., elution of an ethylene or propylene oligomer, in comparison to a container whose inner wall is formed of a polyethylene resin, a polypropylene resin, or a polyethylene-polypropylene resin. An example of the container whose inner wall is formed of a fluororesin can include a Fluoro-Pure PFA composite drum manufactured by Entegris Inc. In addition, it is possible to use containers described on page 4 of JP H3-502677 A, page 3 of WO 2004/016526 A, and pages 9 and 16 of WO 99/046309 A.

It is preferable that these containers (the container body, the cap, and the like) have their inside cleaned before the etching solution is filled. It is preferable that an amount of metallic impurities in a liquid used to clean the containers is reduced.

The prepared etching solution may be bottled in a container such as a gallon bottle or a coated bottle, and the bottled etching solution may be transported or stored.

An interior of the container may be replaced with an inert gas (nitrogen, argon, or the like) having a purity of 99.99995 vol % or more to prevent a change in components of the etching solution during storage. In particular, it is preferable that the gas has a low water content. In addition, when the etching solution is transported and stored, the temperature may be room temperature, or may be controlled to a range of −20 to 20° C. to prevent changes of properties.

The etching solution may be provided as a kit comprising multiple portions of divided raw materials.

{Use}

The etching solution (each of the first embodiment and the second embodiment) is used for a semiconductor treatment. More specifically, the etching solution is preferably used for a semiconductor device.

The "etching solution for a semiconductor device" means that the etching solution is used when manufacturing a semiconductor device.

The etching solution can also be used in a process for manufacturing a semiconductor device. For example, the etching solution can be used for treating a material formed of silicon germanium present on a substrate, an insulating film, a resist film, an anti-reflective film, an etching residue, an ashing residue (hereinafter, also simply referred to as a "residue"), and the like. The etching solution may be used for treating a substrate after chemical mechanical polishing. In particular, the etching solution is preferably used for treating an object to be treated containing Si and SiGe (hereinafter, also simply referred to as an "object to be treated").

{Object to be Treated}

The object to be treated contains Si and SiGe.

A content of the Ge element in SiGe is preferably 10 to 70 atomic % with respect to the total amount of the Si element and the Ge element. For example, according to a typical aspect, the content of the Ge element is 15 atomic %, 30 atomic %, or 50 atomic %, with respect to the total amount of the Si element and the Ge element.

The object to be treated is not particularly limited as long as it contains Si and SiGe, but Si and SiGe are usually arranged on a substrate.

Here, the expression "on the substrate" includes any aspect of front and back surfaces, a side surface, and the inside of a groove of the substrate.

In addition, the expression "Si and SiGe are arranged on the substrate" includes a case where Si and SiGe are directly arranged on a surface of the substrate and a case where Si and SiGe are arranged on the substrate via another layer disposed therebetween.

In addition, the expression "Si and SiGe are arranged on the substrate" means that Si and SiGe are arranged on the substrate at the same time, regardless of how Si and SiGe are arranged. For example, Si and SiGe may be in contact with each other, or may be in contact with each other via another layer or member disposed therebetween. In addition, Si and SiGe may not be in contact with each other while Si and SiGe are arranged on the substrate at the same time.

The substrate is not particularly limited, but examples thereof can include a metal substrate, a semiconductor substrate, a non-metal conductive substrate, a metal oxide substrate, a glass substrate, and a resin substrate. Among them, a semiconductor substrate is preferable.

Examples of the semiconductor substrate can include a semiconductor wafer, a glass substrate for a photomask, a glass substrate for a liquid crystal display, a glass substrate for a plasma display, a substrate for a field emission display (FED), a substrate for an optical disk, a substrate for a magnetic disk, and a substrate for a magneto-optical disk.

Examples of a material for forming the semiconductor substrate can include silicon, a group III-V compound such as GaAs, and a combination thereof.

A size, a thickness, a shape, a layer structure, and the like of the substrate are not particularly limited, but can be appropriately selected as desired.

Si or SiGe may be arranged on the substrate in any form of a film-like form, a wire-like form, a plate-like form, a columnar form, and a particle-like form.

The object to be treated may have, in addition to Si and SiGe, a layer or a structure, or both a layer and a structure, as desired.

For example, one or more members selected from the group consisting of a metal line, a gate electrode, a source electrode, a drain electrode, an insulating layer, a ferromagnetic layer, and a non-magnetic layer may be arranged on the substrate.

The substrate may have an exposed integrated circuit structure.

An example of the integrated circuit structure is an interconnection mechanism such as a metal line and a dielectric material. Examples of a metal and an alloy used in the interconnection mechanism can include aluminum, a copper-aluminum alloy, copper, nickel, nickel silicide, cobalt, cobalt silicide, ruthenium, platinum, gold, titanium, tantalum, tungsten, silicon, titanium nitride, and tantalum nitride. The substrate may have one or more layers formed of a material selected from the group consisting of silicon oxide, silicon nitride, silicon carbide, and carbon-doped silicon oxide.

A method of producing an object to be treated is not particularly limited. For example, an object to be treated may be produced by forming an insulating film on a substrate, arranging SiGe and Si on the insulating film by a sputtering method, a chemical vapor deposition (CVD) method, a molecular beam epitaxy (MBE) method, and the like, and then performing a flattening treatment such as CMP.

Examples of use of the object to be treated can include a dynamic random access memory (DRAM), a ferroelectric random access memory (FRAM) (registered trademark), a magnetoresistive random access memory (MRAM), a phase change random access memory (PRAM), a logic circuit, and a processor.

{Method of Treating Object to be Treated}

A method of treating the object to be treated of the present invention (hereinafter, also referred to as the "present treatment method") includes step A of bringing an etching solution (each of the first embodiment and the second embodiment) into contact with an object to be treated containing Si and SiGe. The present treatment method is performed, whereby SiGe in the object to be treated is selectively etched.

The object to be treated in the present treatment method is as described above.

Step A

Step A of bringing the etching solution into contact with the object to be treated will be described.

A method of bringing the etching solution into contact with the object to be treated can include a method in which the object to be treated is immersed in the etching solution placed in a tank, a method in which the etching solution is sprayed onto the object to be treated, a method in which the etching solution is flown on the object to be treated, and a method in which these methods are combined. A method in which the object to be treated is immersed in the etching solution is preferable.

Further, a mechanical stirring method may be used to further enhance the ability for cleaning the etching solution.

Examples of the mechanical stirring method can include a method in which the etching solution is circulated on the object to be treated, a method in which the etching solution is flow on or sprayed onto the object to be treated, and a method in which the etching solution is stirred by ultrasonic waves or megasonic waves.

A treatment time of step A can be appropriately adjusted. The treatment time (contact time between the etching solution and the object to be treated) is preferably 0.25 to 10 minutes, and more preferably 0.5 to 2 minutes.

A temperature of the etching solution during the treatment is preferably 20 to 100° C., and more preferably 40 to 80° C.

In the present treatment performed using the etching solution of the present invention, an etching ratio of SiGe relative to Si is large. That is, in the present treatment, SiGe in the object to be treated can be well etched while suppressing etching of Si.

In the present treatment, when the content of the Ge element is 30 atomic % with respect to the total amount of the Si element and the Ge element in SiGe, the etching ratio of SiGe relative to Si is preferably 10 or more, more preferably 30 or more, and still more preferably 40 or more.

An upper limit thereof is not particularly limited, but is preferably 1,000 or less.

In addition, in the present treatment, when the content of the Ge element is 30 atomic % with respect to the total amount of the Si element and the Ge element in SiGe, for example, an etching speed of SiGe is preferably 100 angstrom/min or more, more preferably 200 to 500 angstrom/min, and still more preferably 300 to 500 angstrom/min.

In the present treatment, an etching speed of Si is preferably less than 25 angstrom/min and more preferably 0.01 to 15 angstrom/min.

(Rinsing Step)

The present treatment method may include a rinsing step of performing a rinsing treatment on the object to be treated using a rinsing solution, as necessary.

For example, after the object to be treated is brought into contact with the etching solution, the rinsing step may be further performed.

Examples of the rinsing solution can include water, hydrofluoric acid (preferably 0.001 to 1% by mass hydrofluoric acid), hydrochloric acid (preferably 0.001 to 1% by mass hydrochloric acid), hydrogen peroxide water (preferably 0.5 to 31% by mass hydrogen peroxide water, and more preferably 3 to 15% by mass hydrogen peroxide water), a mixed solution of hydrofluoric acid and hydrogen peroxide water (FPM), a mixed solution of sulfuric acid and hydrogen peroxide water (SPM), a mixed solution of ammonia water and hydrogen peroxide water (APM), a mixed solution of hydrochloric acid and hydrogen peroxide water (HPM), carbon dioxide water (preferably 10 to 60 mass ppm carbon dioxide water), ozone water (preferably 10 to 60 mass ppm ozone water), hydrogen water (preferably 10 to 20 mass ppm hydrogen water), an aqueous citric acid solution (preferably 0.01 to 10% by mass aqueous citric acid solution), sulfuric acid (preferably 1 to 10% by mass aqueous sulfuric acid solution), ammonia water (preferably 0.01 to 10% by mass ammonia water), isopropyl alcohol (IPA), an aqueous hypochlorous acid solution (preferably 1 to 10% by mass aqueous hypochlorous acid solution), aqua regia (preferably aqua regia corresponding to a formulation in which a volume ratio of “37% by mass hydrochloric acid:60% by mass nitric acid” is “2.6:1.4” to “3.4:0.6”, ultrapure water, nitric acid (preferably 0.001 to 1% by mass nitric acid), perchloric acid (preferably 0.001 to 1% by mass perchloric acid), an aqueous oxalic acid solution (preferably 0.01 to 10% by mass aqueous oxalic acid solution), acetic acid (preferably 0.01 to 10% by mass aqueous acetic acid solution or acetic acid raw material solution), and an aqueous periodic acid solution (preferably 0.5 to 10% by mass aqueous periodic acid solution, and examples of periodic acid can include ortho-periodic acid and meta periodic acid).

It is preferable that the composition of APM is, for example, in a range (mass ratio) of “ammonia water:hydrogen peroxide water:water=1:1:1” to “ammonia water:hydrogen peroxide water:water=1:3:45”.

It is preferable that the composition of FPM is, for example, in a range (mass ratio) of “hydrofluoric acid: hydrogen peroxide water:water=1:1:1” to “hydrofluoric acid:hydrogen peroxide water:water=1:1:200”.

It is preferable that the composition of SPM is, for example, in a range (mass ratio) of “sulfuric acid:hydrogen peroxide water:water=3:1:0” to “sulfuric acid:hydrogen peroxide water:water=1:1:10”.

It is preferable that the composition of HPM is, for example, in a range (mass ratio) of “hydrochloric acid: hydrogen peroxide water:water=1:1:1” to “hydrochloric acid hydrogen peroxide water:water=1:1:30”.

The description of the preferred composition ratio means a composition ratio in a case where ammonia water is 28% by mass ammonia water, hydrofluoric acid is 49% by mass hydrofluoric acid, sulfuric acid is 98% by mass sulfuric acid, hydrochloric acid is 37% by mass hydrochloric acid, and hydrogen peroxide water is 30% by mass hydrogen peroxide water.

In addition, the volume ratio is based on a volume at room temperature.

The description of [“A:B:C=x:y:z” to “A:B:C=X:Y:Z” ] as the preferred range means that at least one (more preferably two, and more preferably all) of [“A:B=x:y” to “A:B=X:Y” ], [“B:C=y:z” to “B:C=Y:Z” ], and [“A:C=x:z” to “A:C=X:Z” ] is preferably satisfied.

Hydrofluoric acid, nitric acid, perchloric acid, and hydrochloric acid mean aqueous solutions obtained by dissolving HF, $HNO_3$, $HClO_4$, and HCl, respectively, in water.

Ozone water, carbon dioxide water, and hydrogen water mean aqueous solutions obtained by dissolving 03, $CO_2$, and $H_2$, respectively, in water.

These rinsing solutions may be mixed and used as long as the purpose of the rinsing step is not impaired.

In addition, an organic solvent may be contained in the rinsing solution.

A specific method of the rinsing step can include a method in which the object to be treated is brought into contact with the rinsing solution.

Examples of the contact method can include a method in which a substrate is immersed in the rinsing solution placed in a tank, a method in which the rinsing solution is sprayed onto a substrate, a method in which the rinsing solution is flown on a substrate, and a method in which these methods are arbitrarily combined.

A treatment time (contact time between the rinsing solution and the object to be treated) is not particularly limited, but is, for example, 5 seconds to 5 minutes.

A temperature of the rinsing solution during the treatment is not particularly limited, but in general, is preferably 16 to 60° C., and more preferably 18 to 40° C. In a case where SPM is used as the rinsing solution, a temperature thereof is preferably 90 to 250° C.

(Drying Step)

In addition, the present treatment method may include a drying step of performing a drying treatment after the rinsing step, as necessary. A method of performing the drying treatment is not particularly limited, but examples thereof can include spin drying, flowing of dry gas on a substrate, heating a substrate with a heater such as a hot plate or an infrared lamp, isopropyl alcohol (IPA) steam drying, Marangoni drying, Rotagoni drying, and a combination thereof. A drying time varies depending on the specific method to be used, but in general, is about 30 seconds to several minutes.

Other Steps

The present treatment method may include other steps in addition to step A.

Examples of the other steps can include a step of forming one or more structures selected from the group consisting of metal wiring, a gate structure, a source structure, a drain structure, an insulating layer, a ferromagnetic layer, and a non-magnetic layer (for example, layer formation, etching, chemical mechanical polishing, and modification), a resist forming step, an exposure step, a removing step, a heat treatment step, a cleaning step, a drying step, and an inspection step. The present treatment method may be performed at any stage of a back end process (Back end of the line: BEOL), a middle process (Middle of the line: MOL), and a front end process (Front end of the line: FEOL), and is preferably performed in the front end process or the middle process.

EXAMPLES

Hereinafter, the present invention will be described in more detail based on Examples.

Materials, use amounts, ratios, treatment details, treatment procedures, and the like described in the following Examples can be appropriately changed within a range not departing from the gist of the present invention. Accordingly, the scope of the present invention is not to be construed as being limited to the following Examples.

{Preparation of Etching Solution}

In Example 1-1, hydrogen fluoride as a fluoride ion source, acetic acid as a carboxylic acid, hydrogen peroxide, sulfuric acid, a naphthalene sulfonic acid formalin condensate as an organic compound having a sulfonic acid group (“TAKESURF A45-Q”, manufactured by TAKEMOTO OIL & FAT Co., Ltd.), and bromide ions were added to ultrapure water such that their contents shown in Table 1 were satisfied to form a mixed solution, and the mixed solution was sufficiently stirred by a stirrer, thereby obtaining an etching solution of Example 1.

The content of each of the components in Table 1 shows “% by mass” with respect to a total mass of the etching solution. However, a content of the ultrapure water corresponds to a residual mass (residue) in the etching solution excluding the total mass of the components other than the ultrapure water shown in Table 1. In addition, the content of the bromide ions in the etching solution was adjusted to the content of the bromide ions shown in Table 1 by removing the bromide ions through filtration treatment performed on each of the components added to the etching solution and the ultrapure water, followed by adding hydrobromic acid.

Etching solutions of Examples 1-2 to 1-18 and etching solutions of Comparative Examples 1-1 and 1-2 were obtained by the same procedure as that of Example 1-1, except that the type and amount of each of the components were changed according to Table 1.

Etching solutions of Examples 2-1 to 2-8 were obtained by the same procedure as that of Example 1-1, except that the type and amount of each of the components were changed according to Table 2 (Part 1) and Table 2 (Part 2). A concentration of each of the metal elements of Mn, Ni, V, Co, Fe, and Cr in the etching solution was appropriately adjusted by adding these components to the composition to satisfy the values in the table, or performing filtration treatment on the composition.

Each of the blanks in the compound columns shown in Tables 1 and 2 indicates that the corresponding component was not added.

For all the components shown in Tables 1 and 2, components classified into a semiconductor grade or components classified into a high-purity grade equivalent thereto were used.

(Component)

Hereinafter, each of the components described in each table is shown.

(Fluoride Ion Source)

HF: hydrogen fluoride (in each of Examples, hydrofluoric acid was used, and as shown in tables described below, the hydrogen fluoride (HF) was added such that the content thereof was within a predetermined range).

(Carboxylic Acid)

Acetic acid (Hydrogen Peroxide)

Hydrogen peroxide (Solvent)

Ultrapure water

PG: propylene glycol (Bromate Ion)

Bromate ion source: bromic acid (Sulfuric Acid)

S-1: sulfuric acid (Organic Compound Having Sulfonic Acid Group)

S-2: naphthalene sulfonic acid formalin condensate ("TAKESURF A45-Q", manufactured by TAKEMOTO OIL & FAT Co., Ltd.)

S-3: methanesulfonic acid

S-4: $C_{12}$ to $C_{14}$ alkyldiphenyl ether disulfonic acid ("TAKESURF A43-NQ", manufactured by TAKEMOTO OIL & FAT Co., Ltd.)

S-5:triisopropylnaphthalene sulfonic acid ("TAKESURF A47-Q", manufactured by TAKEMOTO OIL & FAT Co., Ltd.)

S-6: p-toluene sulfonic acid

S-7: dodecylbenzene sulfonic acid (Amine)

A-1: N-(3-aminopropyl)diethanolamine

A-2: 3-morpholino-1,2-propanediol

A-3: diisopropanolamine (Metallic Impurity)

Each of the contents of Mn, Ni, V, Co, Fe, and Cr shown in Table 2 (Part 2) was measured using Agilent 8800 triple quadrupole inductively coupled plasma mass spectrometry (ICP-MS, for semiconductor analysis, option #200).

<Measurement Condition>

As a sample introduction system, a quartz torch, a coaxial perfluoroalkoxyalkane (PFA) nebulizer (for self-suction), and a platinum interface cone were used. The measurement parameters of cool plasma conditions are as below.

Output of radio frequency (RF) (W): 600

Flow rate of carrier gas (L/min): 0.7

Flow rate of makeup gas (L/min): 1

Sampling depth (mm): 18

In the measurement of the content of each of the element components, the etching solution itself whose content was to be determined was set as a measurement target. In a case where the etching solution itself was set as a measurement target and the content of each of the element components present in the etching solution was less than a detection limit, the measurement was performed again with the etching solution to be measured being appropriately concentrated, and the obtained measurement value was converted in accordance with the concentration of the etching solution before being concentrated to calculate the content of each of the element components.

{Test and Evaluation}

The following tests were performed using the prepared etching solution of each of Examples or Comparative Examples.

(Evaluation of Etching Speed)

A substrate on which silicon germanium (Si. Ge=70:30 (element ratio), also described as SiGe30 below) having a film thickness of 100 nm was stacked and a substrate on which silicon having a film thickness of 100 nm was stacked were prepared, and each of the substrates was cut into 2×2 cm squares, thereby preparing test pieces. Hereinafter, the stacked films are also referred to as a "SiGe film" and a "Si film".

The test piece was immersed in the etching solution (25° C.) of Example or Comparative Example for 10 minutes.

Before and after the immersion test, film thicknesses of the SiGe film or the Si film stacked on the substrate was measured with an optical film-thickness meter Ellipsometer M-2000 (manufactured by JA Woollam). An etching speed (angstrom/min) of each film when using each etching solution was calculated from the film thicknesses measured before and after the immersion.

The results of the evaluation of the etching speed of each of the SiGe film and the Si film using each etching solution are shown in Tables 1 and 2.

(Evaluation of Surface Smoothness)

When the etching treatment is performed using the etching solution, it is preferable that the surface smoothness of SiGe after treatment is high, because it highly contributes to processing accuracy of the device and also leads to improvement of a yield.

In the film thickness evaluation in the etching ratio evaluation test, the film thickness and the surface roughness (Ra) were simultaneously measured using an optical film-thickness meter Ellipsometer M-2000 (manufactured by JA Woollam).

The surface roughness (Ra) determined when the evaluation of the surface smoothness was performed using each etching solution is shown in Tables 1 and 2. It is preferable that Ra is small.

(Evaluation of Storage Stability)

Next, a storage test was performed using the etching solution of each of Examples and Comparative Examples to evaluate the storage stability of each etching solution.

Specifically, first, a high-density polyethylene container having a capacity of 250 mL was filled with 200 mL of each etching solution, and then the container was sealed. The container filled with the etching solution was stored in an environment of 25° C. for 7 days.

The evaluation test of the etching speed of the SiGe film was performed according to the evaluation method of the etching speed of the SiGe film except for using the etching solution after the storage test. When an etching speed (angstrom/min) of the SiGe film determined using the etching solution before performing the storage test (the etching solution immediately after preparation) was 100%, a maintenance rate (=[etching speed (angstrom/min) of SiGe film determined using etching solution after storage test]/[etching speed (angstrom/min) of SiGe film determined using etching solution immediately after preparation]×100) of the etching speed (angstrom/min) of the SiGe film determined using the etching solution after the storage test was calculated. Hereinafter, the above maintenance rate is also simply referred to as a "maintenance rate".

The maintenance rate determined when the evaluation of the storage stability was performed using each etching solution is shown in Tables 1 and 2.

"Residue" in the column of "Ultrapure water" in Tables 1 and 2 means that a remaining part other than the components (the fluoride ion source, the carboxylic acid, the hydrogen peroxide, the percarboxylic acid, the bromide ions, the bromate ions, the sulfuric acid, the organic compound having a sulfonic acid group, the amine, and PG) shown in Tables 1 and 2 corresponds to "ultrapure water".

"ppt", "ppm", and "ppb" in Tables 1 and 2 mean "mass ppt", "mass ppm", and "mass ppb", respectively.

In Tables 1 and 2, the content ratio A represents the content (% by mass) of the carboxylic acid with respect to the total mass of the carboxylic acid, the percarboxylic acid, and the hydrogen peroxide, the content ratio B represents the content (% by mass) of the hydrogen peroxide with respect to the total mass of the carboxylic acid, the percarboxylic acid, and the hydrogen peroxide, and the content ratio C represents the content (% by mass) of the percarboxylic acid with respect to the total mass of the carboxylic acid, the percarboxylic acid, and the hydrogen peroxide.

The components and the evaluation results of the etching solutions in Examples 1-1 to 1-18 and Comparative Example 1-1 to 1-2 are shown in Table 1 (Part 1) and Table 1 (Part 2). For example, in Example 1-1, the content of the fluoride ion source was 0.2% by mass, the content ratio A was 79.9%, and SiGe30 (angstrom/min) was 338.

The components and the evaluation results of the etching solutions in Examples 2-1 to 2-8 are shown in Table 2 (Part 1) and Table 2 (Part 2). For example, in Example 2-1, the content of the fluoride ion source was 0.2% by mass, the content of Mn was 0.5 mass ppb, and SiGe30 (angstrom/min) was 345.

In addition, in Tables 1 and 2, "SeGe30/Si" represents a ratio of the etching speed of SiGe described in the column of "SiGe30 (angstrom/min)" to the etching speed of Si described in the column of "Si (angstrom/min)".

In addition, the ratio of the carboxylic acid to the bromide ions, the ratio of the percarboxylic acid to the metallic impurity, and the ratio of the fluoride ion source to the metallic impurity are also shown in Table 2 (Part 2).

In each table, the notation of "E−n" means "$\times 10^{-n}$", and the notation of "E+n" means "$\times 10^{n}$". "n" represents an integer.

In Table 1, the notation of "<X" means that a value thereof is smaller than X. In addition, the notation of "-" means a case where the evaluation was not performed or a case where a value thereof could not be calculated.

TABLE 1

(Part 1)

| | Fluoride ion source HF (% by mass) | Carboxylic acid Acetic acid (% by mass) | Hydrogen peroxide (% by mass) | Percarboxylic acid Peracetic acid (% by mass) | Bromide ion | Bromate ion | Sulfuric acid and organic compound having sulfonic acid group Compound |
|---|---|---|---|---|---|---|---|
| Example 1-1 | 0.2 | 61.2 | 2.9 | 12.6 | 30 ppt | | S-1 |
| Example 1-2 | 0.2 | 59.0 | 3.0 | 13.1 | 50 ppt | | S-3 |
| Example 1-3 | 0.3 | 62.3 | 4.1 | 11.3 | 350 ppm | | S-1 |
| Example 1-4 | 0.1 | 61.2 | 2.9 | 12.6 | 20 ppt | | S-1 |
| Example 1-5 | 0.4 | 60.2 | 2.9 | 12.6 | 10 ppt | | S-1 |
| Example 1-6 | 0.3 | 62.3 | 4.1 | 11.3 | 20 ppt | | S-3 |
| Example 1-7 | 0.2 | 63.0 | 3.5 | 10.2 | 5 ppt | | |
| Example 1-8 | 0.2 | 24.4 | 1.5 | 5.3 | 50 ppt | | |
| Example 1-9 | 0.2 | 36.5 | 2.0 | 8.1 | 90 ppt | | |
| Example 1-10 | 0.2 | 59.1 | 3.1 | 12.2 | 20 ppt | 50 ppm | S-1 |
| Example 1-11 | 0.3 | 51.0 | 4.8 | 9.1 | 10 ppt | | |
| Example 1-12 | 0.4 | 60.9 | 3.1 | 12.3 | 40 ppt | 50 ppm | |
| Example 1-13 | 0.4 | 61.1 | 2.9 | 12.1 | 40 ppb | | S-6 |
| Example 1-14 | 0.4 | 60.9 | 3.1 | 12.3 | 40 ppt | 110 ppm | |
| Example 1-15 | 0.4 | 60.9 | 3.1 | 12.3 | 40 ppt | 10 ppm | |
| Example 1-16 | 0.4 | 61.1 | 2.9 | 12.1 | 40 ppt | 500 ppb | |
| Example 1-17 | 0.2 | 59.1 | 2.9 | 11.7 | 10 ppt | | S-1 |
| Example 1-18 | 0.2 | 55.0 | 3.1 | 12.0 | 5 ppt | | S-1 |
| Comparative Example 1-1 | 0.2 | 53.0 | 0.5 | 1.1 | 500 ppm | | S-1 |
| Comparative Example 1-2 | 0.2 | | 10.0 | | 40 ppt | | S-1 |

TABLE 1-continued (Part 1)

| | Sulfuric acid and organic compound having sulfonic acid group | | | Amine | | Solvent | |
|---|---|---|---|---|---|---|---|
| | Content (% by mass) | Compound | Content (% by mass) | Compound | Content (% by mass) | Ultrapure water | PG (% by mass) |
| Example 1-1 | 0.9 | S-2 | 0.01 | | | Residue | |
| Example 1-2 | 0.80 | | | | | Residue | |
| Example 1-3 | 0.5 | S-4 | 0.01 | | | Residue | |
| Example 1-4 | 0.2 | S-5 | 0.01 | | | Residue | |
| Example 1-5 | 0.4 | S-2 | 0.01 | A-1 | 0.03 | Residue | |
| Example 1-6 | 0.5 | S-5 | 0.02 | | | Residue | |
| Example 1-7 | | | | | | Residue | |
| Example 1-8 | | | | | | Residue | |
| Example 1-9 | | | | | | Residue | |
| Example 1-10 | 0.8 | S-5 | 0.01 | A-1 | 0.02 | Residue | |
| Example 1-11 | | | | | | Residue | 10.0 |
| Example 1-12 | | | | | | Residue | |
| Example 1-13 | 0.01 | | | | | Residue | |
| Example 1-14 | | | | | | Residue | |
| Example 1-15 | | | | | | Residue | |
| Example 1-16 | | | | | | Residue | |
| Example 1-17 | 0.4 | S-4 | 0.01 | A-2 | 0.05 | Residue | |
| Example 1-18 | 0.4 | | | A-3 | 0.1 | Residue | |
| Comparative Example 1-1 | 0.7 | | | | | Residue | |
| Comparative Example 1-2 | 1 | | | | | Residue | |

TABLE 1

(Part 2)

| | Content ratio A (%) | Content ratio B (%) | Content ratio C (%) | Evaluation SiGe 30 (Å/min) | Evaluation Si (Å/min) | Evaluation SiGe 30/Si | Surface smoothness Ra (nm) | Maintenance rate SiGe 30 (%) |
|---|---|---|---|---|---|---|---|---|
| Example 1-1 | 79.9 | 3.7 | 16.4 | 338 | 8 | 42.3 | 2.1 | 99 |
| Example 1-2 | 78.6 | 4.0 | 17.4 | 310 | 7 | 44.3 | 2.3 | 101 |
| Example 1-3 | 80.2 | 5.3 | 14.5 | 406 | 10 | 40.6 | 1.8 | 99 |
| Example 1-4 | 79.9 | 3.7 | 16.4 | 231 | 5 | 46.2 | 2.7 | 103 |
| Example 1-5 | 79.6 | 3.8 | 16.6 | 441 | 11 | 40.1 | 2.3 | 99 |
| Example 1-6 | 80.2 | 5.3 | 14.5 | 388 | 9 | 43.1 | 1.8 | 98 |
| Example 1-7 | 82.1 | 4.6 | 13.3 | 332 | 14 | 23.7 | 2.8 | 100 |
| Example 1-8 | 78.2 | 4.8 | 17.0 | 212 | 15 | 14.1 | 2.4 | 90 |
| Example 1-9 | 78.3 | 4.3 | 17.4 | 278 | 21 | 13.2 | 2.4 | 90 |
| Example 1-10 | 79.4 | 4.2 | 16.4 | 333 | 7 | 47.6 | 2.6 | 100 |
| Example 1-11 | 78.6 | 7.4 | 14.0 | 341 | 16 | 21.3 | 1.8 | 59 |
| Example 1-12 | 79.8 | 4.1 | 16.1 | 421 | 11 | 38.3 | 2.2 | 100 |
| Example 1-13 | 80.3 | 3.8 | 15.9 | 411 | 10 | 41.1 | 3.1 | 85 |
| Example 1-14 | 79.8 | 4.1 | 16.1 | 398 | 10 | 39.8 | 1.8 | 100 |
| Example 1-15 | 79.8 | 4.1 | 16.1 | 425 | 11 | 38.6 | 1.9 | 90 |
| Example 1-16 | 80.3 | 3.8 | 15.9 | 421 | 11 | 38.3 | 2.2 | 87 |
| Example 1-17 | 80.2 | 3.9 | 15.9 | 321 | 8 | 40.1 | 1.5 | 98 |
| Example 1-18 | 78.5 | 4.4 | 17.1 | 307 | 7 | 43.9 | 2.7 | 98 |
| Comparative Example 1-1 | 97.1 | 0.9 | 2.0 | 2 | 1 | 2.0 | 2.2 | 39 |
| Comparative Example 1-2 | 0.0 | 100.0 | 0.0 | <1 | <1 | — | 1.1 | — |

TABLE 2

(Part 1)

| | Fluoride ion source HF (% by mass) | Carboxylic acid Acetic acid (% by mass) | Hydrogen peroxide (% by mass) | Percarboxylic acid Peracetic acid (% by mass) | Bromide ion (mass ppt) | Bromate ion (mass ppm) | Sulfuric acid and compound having sulfonic acid group Compound |
|---|---|---|---|---|---|---|---|
| Example 2-1 | 0.2 | 61.0 | 3.6 | 11.7 | 10 | | |
| Example 2-2 | 0.1 | 61.2 | 2.9 | 12.6 | 50 | | S-1 |
| Example 2-3 | 0.4 | 60.2 | 2.9 | 12.6 | 30 | 50 | |
| Example 2-4 | 0.3 | 62.3 | 4.1 | 11.3 | 20 | | S-1 |
| Example 2-5 | 0.2 | 63.0 | 3.5 | 10.2 | 20 | | |
| Example 2-6 | 0.2 | 55.0 | 3.0 | 9.5 | 40 | | S-1 |
| Example 2-7 | 0.05 | 62.0 | 3.0 | 12.3 | 30 | 20 | S-1 |
| Example 2-8 | 0.2 | 49.7 | 4.1 | 10.5 | 50 | | S-1 |

| | Sulfuric acid and compound having sulfonic acid group | | | Amine | | |
|---|---|---|---|---|---|---|
| | Content (% by mass) | Compound | Content (% by mass) | Compound | Content (% by mass) | Solvent Ultrapure water |
| Example 2-1 | | | | | | Residue |
| Example 2-2 | 0.7 | S-7 | 0.01 | | | Residue |
| Example 2-3 | | | | | | Residue |
| Example 2-4 | 0.8 | S-5 | 0.01 | A-3 | 0.02 | Residue |
| Example 2-5 | | | | | | Residue |
| Example 2-6 | 0.5 | S-6 | 1.00 | | | Residue |
| Example 2-7 | 0.4 | | | A-2 | 0.02 | Residue |
| Example 2-8 | 0.8 | S-5 | 0.01 | | | Residue |

TABLE 2

(Part 2)

| | Metallic impurity | | | | | | | Content | Content | Content | Ratio of carboxylic |
|---|---|---|---|---|---|---|---|---|---|---|---|
| | Mn (ppb) | Ni (ppb) | V (ppb) | Co (ppb) | Fe (ppb) | Cr (ppb) | Total (ppb) | ratio A (%) | ratio B (%) | ratio C (%) | acid to bromide ion |
| Example 2-1 | 0.5 | 0.5 | 0.4 | 0.8 | 0.7 | 0.8 | 3.7 | 80.0 | 4.7 | 15.3 | 6.1E+10 |
| Example 2-2 | 0.9 | 0.8 | 0.3 | 0.4 | 0.5 | 0.6 | 3.5 | 79.9 | 3.7 | 16.4 | 1.2E+10 |
| Example 2-3 | 0.8 | 0.4 | 0.3 | 0.9 | 0.7 | 0.6 | 3.7 | 79.6 | 3.8 | 16.6 | 2.0E+10 |
| Example 2-4 | 0.2 | 0.4 | 0.3 | 0.6 | 0.4 | 0.3 | 2.2 | 80.2 | 5.3 | 14.5 | 3.1E+10 |
| Example 2-5 | 0.4 | 0.5 | 0.8 | 0.8 | 3 | 0.7 | 6.2 | 82.1 | 4.6 | 13.3 | 3.2E+10 |
| Example 2-6 | 0.6 | 0.9 | 0.8 | 0.8 | 0.9 | 0.9 | 4.9 | 81.5 | 4.4 | 14.1 | 1.4E+10 |
| Example 2-7 | 0.3 | 0.9 | 0.9 | 0.8 | 0.9 | 0.9 | 4.7 | 80.2 | 3.9 | 15.9 | 2.1E+10 |
| Example 2-8 | 0.4 | 0.6 | 0.3 | 0.7 | 0.8 | 0.3 | 3.1 | 77.3 | 6.4 | 16.3 | 9.9E+09 |

| | Ratio of percarboxylic acid to | Ratio of fluoride ion source | Evaluation | | | Maintenance rate |
|---|---|---|---|---|---|---|
| | metallic impurity | to metallic impurity | SiGe 30 (Å/min) | Si (Å/min) | SiGe 30/Si | SiGe 30 (%) |
| Example 2-1 | 3.2E+09 | 5.4E+07 | 345 | 13 | 26.5 | 98 |
| Example 2-2 | 3.6E+09 | 2.9E+07 | 231 | 9 | 25.7 | 99 |
| Example 2-3 | 3.4E+09 | 1.1E+08 | 441 | 11 | 40.1 | 100 |
| Example 2-4 | 5.1E+09 | 1.4E+08 | 388 | 10 | 38.8 | 98 |
| Example 2-5 | 1.6E+09 | 3.2E+07 | 332 | 14 | 23.7 | 85 |
| Example 2-6 | 1.9E+09 | 4.1E+07 | 351 | 16 | 21.9 | 85 |
| Example 2-7 | 2.6E+09 | 1.1E+07 | 231 | 9 | 25.7 | 86 |
| Example 2-8 | 3.4E+09 | 6.5E+07 | 312 | 8 | 39.0 | 79 |

From the comparison of Examples 1-1 to 1-18 and 2-1 to 2-8 with Comparative Examples 1-1 and 1-2, it was confirmed that the etching solution of the present invention had a large etching ratio of SiGe relative to Si and excellent storage stability.

From the comparison of Examples 1-12 and 1-14 to 1-16 with other Examples, it was confirmed that in the case where the bromate ions were contained, and the content of the bromate ions was 1 to 100 mass ppm with respect to the total mass of the etching solution, the etching speed of SiGe was high, and the storage stability was more excellent.

From the comparison of Example 1-11 with other Examples, it was confirmed that in the case where the alcohol-based solvent was not contained in the etching solution, the effects of the present invention were more excellent.

From the comparison of Examples 1-7 to 1-9 with Examples 1-1, 1-3 to 1-5, 1-10, 1-17, and 1-18, it was confirmed that in the case where the sulfuric acid was contained in the etching solution, the effects of the present invention were more excellent.

From the comparison of Examples 1-7 to 1-9 with Examples 1-2 to 1-6, 1-13, and 1-17, it was confirmed that in the case where the organic compound having a sulfonic acid group was contained in the etching solution, the effects of the present invention were more excellent.

From the comparison of Example 2-5 with Examples 2-1 to 2-4, it was confirmed that when the metallic impurity component including one or more elements selected from the group consisting of Mn, Ni, V, Co, Fe, and Cr was contained in the etching solution, and the content of each of the element components included in the metallic impurity component was less than 1.0 mass ppb with respect to the total mass of the etching solution, the effects of the present invention were more excellent.

From the comparison of Example 2-6 with Examples 2-1 to 2-4, it was confirmed that when the mass ratio of the content of the percarboxylic acid to the total content of the specific elements included in the metallic impurity component was $2.0\times10^9$ or more, the effects of the present invention were more excellent.

From the comparison of Example 2-7 with Examples 2-1 to 2-4, it was confirmed that when the mass ratio of the content of the fluoride ion source to the total content of the specific elements included in the metallic impurity component was $2.0\times10^7$ or more, the effects of the present invention were more excellent.

From the comparison of Example 2-8 with Examples 2-1 to 2-4, it was confirmed that when the mass ratio of the content of the carboxylic acid to the content of the bromide ions was $1.0\times10^{10}$ or more, the effects of the present invention were more excellent.

In addition, in Example 1-19, the etching solution containing hydrofluoric acid (used so as to have the content of hydrofluoric acid of 0.2% by mass), acetic acid (content: 60.5% by mass), hydrogen peroxide (content: 10% by mass), peracetic acid (content: 11.8% by mass), bromide ions (content: 1 mass ppt), S-1 (content: 1% by mass), and water (residue) was obtained. The above contents represent the contents of the respective components with respect to the total mass of the etching solution, and water accounts for the remaining part.

When the evaluation is performed using the etching solution prepared in Example 1-19, the etching ratio of SiGe relative to Si is large and the storage stability is excellent, as in Examples 1-1 to 1-18. However, in Example 1-19, the surface roughness of SiGe after the treatment is larger than that in Example 1-18.

In addition, by using the etching solution prepared in each of Example 1-1, Example 1-7, and Example 1-10, the etching speed of the SiGe film was determined by performing [Evaluation of Etching Speed] using the silicon germanium (Si:Ge=50:50 (element ratio)) instead of the silicon germanium (Si:Ge=70:30 (element ratio)) used in the foregoing [Evaluation of Etching Speed]. The results obtained by using the etching solutions of Example 1-1, Example 1-7, and Example 1-10 were 540 angstrom/min, 501 angstrom/min, and 536 angstrom/min, respectively.

In addition, by using the etching solution prepared in each of Examples 1-1 to 1-6, Example 1-10, and Example 1-17, the etching speed of the SiGe film was determined by performing [Evaluation of Etching Speed] using the silicon germanium (Si:Ge=85:15 (mass ratio)) instead of the silicon germanium (Si:Ge=70:30 (mass ratio)) used in the foregoing [Evaluation of Etching Speed]. The results obtained by using the etching solutions of Examples 1-1 to 1-6, Example 1-10, and Example 1-17 were 30 angstrom/min, 40 angstrom/min, 39 angstrom/min, 13 angstrom/min, 42 angstrom/min, 37 angstrom/min, 29 angstrom/min, and 44 angstrom/min, respectively.

In addition, by using the etching solution prepared in each of Example 2-1, Example 2-5, and Example 2-6, the etching speed of the SiGe film was determined by performing [Evaluation of Etching Speed] using the silicon germanium (Si:Ge=50:50 (mass ratio)) instead of the silicon germanium (Si:Ge=70:30 (mass ratio)) used in the foregoing [Evaluation of Etching Speed]. The results obtained by using the etching solutions of Example 2-1, Example 2-5, and Example 2-6 were 512 angstrom/min, 501 angstrom/min, and 499 angstrom/min, respectively. In addition, by using the etching solution prepared in each of Examples 2-1 to 2-4 and Examples 2-6 and 2-7, the etching speed of the SiGe film was determined by performing [Evaluation of Etching Speed] using the silicon germanium (Si:Ge=85:15 (mass ratio)) instead of the silicon germanium (Si:Ge=70:30 (mass ratio)) used in the foregoing [Evaluation of Etching Speed]. The results obtained by using the etching solutions of Examples 2-1 to 2-4 and Examples 2-6 and 2-7 were 41 angstrom/min, 13 angstrom/min, 42 angstrom/min, 37 angstrom/min, 45 angstrom/min, and 12 angstrom/min, respectively.

What is claimed is:

1. A semiconductor etching solution comprising:
a fluoride ion source;
a carboxylic acid;
a percarboxylic acid;
hydrogen peroxide;
bromide ions; and
an organic compound having a sulfonic acid group,
wherein a content of the bromide ions is less than 500 mass ppm with respect to a total mass of the semiconductor etching solution, and
the organic compound having the sulfonic acid group is a polymer having a repeating unit having a sulfonic acid group.

2. The semiconductor etching solution according to claim 1, wherein the content of the bromide ions is 5 mass ppt or more with respect to the total mass of the semiconductor etching solution.

3. The semiconductor etching solution according to claim 1, wherein a mass ratio of a content of the carboxylic acid to the content of the bromide ions is $1.0\times10^{10}$ or more.

4. The semiconductor etching solution according to claim 1, wherein the carboxylic acid is acetic acid, and the percarboxylic acid is peracetic acid.

5. The semiconductor etching solution according to claim 1, wherein the fluoride ion source is hydrogen fluoride.

6. The semiconductor etching solution according to claim 1, further comprising bromate ions, wherein a content of the bromate ions is 1 to 100 mass ppm with respect to the total mass of the semiconductor etching solution.

7. The semiconductor etching solution according to claim 1, wherein an alcohol-based solvent is not contained.

8. The semiconductor etching solution according to claim 1, further comprising sulfuric acid.

9. The semiconductor etching solution according to claim 1, further comprising an amine.

10. The semiconductor etching solution according to claim 1, further comprising a metallic impurity component including one or more elements selected from the group consisting of Mn, Ni, V, Co, Fe, and Cr, wherein a content of each of the elements included in the metallic impurity component is less than 1.0 mass ppb with respect to the total mass of the semiconductor etching solution.

11. The semiconductor etching solution according to claim 10, wherein a mass ratio of a content of the percarboxylic acid to a total content of the elements included in the metallic impurity component is $2.0\times10^9$ or more.

12. The semiconductor etching solution according to claim 10, wherein a mass ratio of a content of the fluoride ion source to a total content of the elements included in the metallic impurity component is $2.0\times10^7$ or more.

13. A semiconductor etching solution comprising:

a fluoride ion source;

a carboxylic acid;

a percarboxylic acid;

hydrogen peroxide;

at least one compound selected from the group consisting of N-(3-aminopropyl)diethanolamine, 3-morpholino-1, 2-propanediol, and diisopropanolamine;

at least one compound selected from the group consisting of naphthalene sulfonic acid formalin condensate, methanesulfonic acid, C12 to C14 alkyldiphenyl ether disulfonic acid, and triisopropylnaphthalene sulfonic acid;

bromide ions; and an organic compound having a sulfonic acid group, wherein a content of the bromide ions is less than 500 mass ppm with respect to a total mass of the semiconductor etching solution, and the organic compound having the sulfonic acid group is a polymer having a repeating unit having a sulfonic acid group.

14. A semiconductor etching solution comprising:

a fluoride ion source;

a carboxylic acid;

a percarboxylic acid;

hydrogen peroxide; and an organic compound having a sulfonic acid group, wherein a content of the carboxylic acid, a content of the percarboxylic acid, and a content of the hydrogen peroxide are 55.0 to 94.0% by mass, 5.0 to 25.0% by mass, and 1.0 to 20.0% by mass, respectively, with respect to a total mass of the carboxylic acid, the percarboxylic acid, and the hydrogen peroxide, and the organic compound having the sulfonic acid group is a polymer having a repeating unit having a sulfonic acid group.

15. A semiconductor etching solution comprising:

a fluoride ion source;

a carboxylic acid;

a percarboxylic acid;

hydrogen peroxide;

at least one compound selected from the group consisting of N-(3-aminopropyl)diethanolamine, 3-morpholino-1, 2-propanediol, and diisopropanolamine;

at least one compound selected from the group consisting of naphthalene sulfonic acid formalin condensate, methanesulfonic acid, C12 to C14 alkyldiphenyl ether disulfonic acid, and triisopropylnaphthalene sulfonic acid; and an organic compound having a sulfonic acid group, wherein a content of the carboxylic acid, a content of the percarboxylic acid, and a content of the hydrogen peroxide are 55.0 to 94.0% by mass, 5.0 to 25.0% by mass, and 1.0 to 20.0% by mass, respectively, with respect to a total mass of the carboxylic acid, the percarboxylic acid, and the hydrogen peroxide, and the organic compound having the sulfonic acid group is a polymer having a repeating unit having a sulfonic acid group.

16. A process for manufacturing a semiconductor device, using the semiconductor etching solution according to claim 1.

* * * * *